United States Patent
Yüksel et al.

(10) Patent No.: US 11,205,131 B2
(45) Date of Patent: Dec. 21, 2021

(54) SEQUENCE DETECTION

(71) Applicant: International Business Machines Corporation, Armonk, NY (US)

(72) Inventors: Hazar Yüksel, New York, NY (US); Giovanni Cherubini, Rueschlikon (CH); Roy Cideciyan, Rüschlikon (CH); Simeon Furrer, Altdorf (CH); Marcel Kossel, Reichenburg (CH)

(73) Assignee: International Business Machines Corporation, Armonk, NY (US)

(*) Notice: Subject to any disclaimer, the term of this patent is extended or adjusted under 35 U.S.C. 154(b) by 951 days.

(21) Appl. No.: 15/923,772

(22) Filed: Mar. 16, 2018

(65) Prior Publication Data

US 2019/0287011 A1   Sep. 19, 2019

(51) Int. Cl.
| | | |
|---|---|---|
| H04L 27/06 | (2006.01) | |
| G06N 7/00 | (2006.01) | |
| G06N 5/00 | (2006.01) | |
| H03M 13/41 | (2006.01) | |
| H03M 13/39 | (2006.01) | |

(52) U.S. Cl.
CPC ............ *G06N 7/005* (2013.01); *G06N 5/003* (2013.01); *H03M 13/4138* (2013.01); *H03M 13/3961* (2013.01)

(58) Field of Classification Search
CPC ... G06N 7/005; G06N 5/003; H03M 13/4138; H03M 13/3961
USPC .......................... 375/341, 340, 219, 295, 316
See application file for complete search history.

(56) References Cited

U.S. PATENT DOCUMENTS

| | | | |
|---|---|---|---|
| 6,788,750 B1 * | 9/2004 | Reuven ............... | H03M 13/256 375/262 |
| 7,653,868 B2 | 1/2010 | Haratsch | |
| 7,961,797 B1 | 6/2011 | Yang et al. | |
| 8,976,911 B2 | 3/2015 | Eliaz | |
| 9,191,247 B1 | 11/2015 | Stopler et al. | |

(Continued)

FOREIGN PATENT DOCUMENTS

WO    WO2017050352 A1    3/2017

OTHER PUBLICATIONS

Shr et al. "A Low-Complexity Viterbi Decoder for Space-Time Trellis Codes", IEEE Transactions on Circuits and Systems I: Regular Papers (vol. 57, Issue: 4, Apr. 2010), pp. 873-885.

(Continued)

*Primary Examiner* — Zewdu A Kassa
(74) *Attorney, Agent, or Firm* — Scully, Scott, Murphy & Presser, PC; Daniel P. Morris, Esq.

(57) ABSTRACT

Methods and apparatus are provided for calculating branch metrics, associated with possible transitions between states of a trellis, in a sequence detector for detecting symbol values corresponding to samples of an analog signal transmitted over a channel. For each sample and each transition, the method calculates a plurality of distance values indicative of distance between that sample and respective hypothesized sample values for that transition. In parallel with calculation of the distance values, the sample is compared with a set of thresholds, each defined between a pair of successive hypothesized symbol values arranged in value order, to produce a comparison result. An optimum distance value is selected as a branch metric for the transition in dependence on the comparison result.

20 Claims, 5 Drawing Sheets

(56) References Cited

U.S. PATENT DOCUMENTS

2005/0243941 A1* 11/2005 Anim-Appiah ......... H04L 1/006
                                                  375/265
2007/0217522 A1*  9/2007 Sun ...................... H03M 13/31
                                                  375/242
2008/0189532 A1*  8/2008 Haratsch ........... H04L 25/03235
                                                  712/239

OTHER PUBLICATIONS

Black et al., "A 1-Gb/s, Four-State, Sliding Block Viterbi Decoder", IEEE Journal of Solid-State Circuits, vol. 32, No. 6, Jun. 1997, pp. 797-805.

Hatamian et al., "Design Considerations for Gigabit Ethernet 1000Base-T Twisted Pair Transceivers", IEEE 1998 Custom Integrated Circuits Conference, May 14, 1998, pp. 335-342.

Haratsch et al., "A 1-Gb/s Joint Equalizer and Trellis Decoder for 1000Base-T Gigabit Ethernet", IEEE Journal of Solid-State Circuits, vol. 36, No. 3, Mar. 2001, pp. 374-384.

Fettweis et al., "A 100Mbit/S Decoder Chip: Novel Architecture and Its Realization", 1990 IEEE, ICC'90 Supercomm Technical Sessons, International Conference on Communications, Apr. 16-19, 1990, pp. 463-467.

Fettweis et al., "High-Speed Parallel Viterbi Decoding: Algorithm and VLSI-Architecture", IEEE Communications Mag., vol. 29, No. 5, May 1991, pp. 46-55.

* cited by examiner

Sub-BMU for calculating $\lambda_k(0,0)$

Sub-BMU unit for calculating $\lambda_k(\mathbb{A}_0, l)$

Sub-BMU unit for calculating $\lambda_k(\mathbb{A}_1, l)$

SEQUENCE DETECTION

BACKGROUND

The present invention relates generally to sequence detection, and more particularly to calculation of branch metrics in sequence detectors for detecting symbol sequences transmitted over a channel.

Sequence detectors are used for detecting a sequence of data symbols communicated via an analog signal transmitted over a channel whose output is sampled at the receiver. For a given sample sequence obtained from a channel, the aim of such detectors is to determine the most likely symbol values for the symbol sequence supplied to the channel input. In data transmission, a sequence of input symbols drawn from a signal constellation is typically used to modulate some continuous waveform which is transmitted through a dispersive channel and sampled at the receiver. These samples would ideally equal the corresponding input symbols. However, they are corrupted by noise and interference with neighboring transmitted symbols. The latter phenomenon is commonly referred to as intersymbol interference (ISI). Sequence detectors such as Viterbi detectors (also called "Viterbi decoders") use recursive methods to determine the most probable input symbol sequence. Such detectors for high-speed data transmission play a vital role in designing receivers in compliance with recently approved communications standards, e.g. the IEEE P802.3bj standard for 100 Gb/s Ethernet, and upcoming communications standards, e.g. the IEEE P802.3bs standard for 400 Gb/s Ethernet.

Sequence detectors typically include a series of units which process successive input samples to select survivor paths through a trellis. For an n-state trellis, n survivor paths are selected, each corresponding to a possible sequence of symbol values for samples processed thus far. The component units of a sequence detector comprise a branch metric unit, a path metric unit, and a survivor memory unit. The branch metric unit receives the input samples and calculates branch metrics associated with the possible transitions between states of the trellis for each sample. The branch metric for each transition is obtained by comparing distances between the input sample and hypothesized sample values for that transition. The path metric unit receives and accumulates the branch metrics to obtain path metrics for the survivor path to each state of the trellis, and selects a latest symbol value in each survivor path. The symbol decisions are stored in the survivor memory unit, where the survivor paths are updated in each time step. At the end of the input sample sequence, one survivor path is selected as the optimum (i.e. most likely) path. This optimum path defines the detected sequence of symbol values.

SUMMARY

According to at least one embodiment of the present invention there is provided a method for calculating branch metrics, associated with possible transitions between states of a trellis, in a sequence detector for detecting symbol values corresponding to samples of an analog signal transmitted over a channel. For each sample and each transition, the method calculates a plurality of distance values indicative of distance between that sample and respective hypothesized sample values for that transition. In parallel with calculation of the distance values, the sample is compared with a set of thresholds, each defined between a pair of successive hypothesized symbol values arranged in value order, to produce a comparison result. An optimum distance value is selected as a branch metric for the transition in dependence on the comparison result.

Respective further embodiments of the invention provide a branch metric unit adapted to implement a method defined above, and a sequence detector including such a branch metric unit. At least one additional embodiment of the invention provides a computer program product comprising a computer-readable storage medium embodying program instructions which are executable by a processing device to cause the processing device to perform the branch metric calculation method.

Embodiments of the invention will be described in more detail below, by way of illustrative and non-limiting example, with reference to the accompanying drawings.

DETAILED DESCRIPTION

Figure 1:
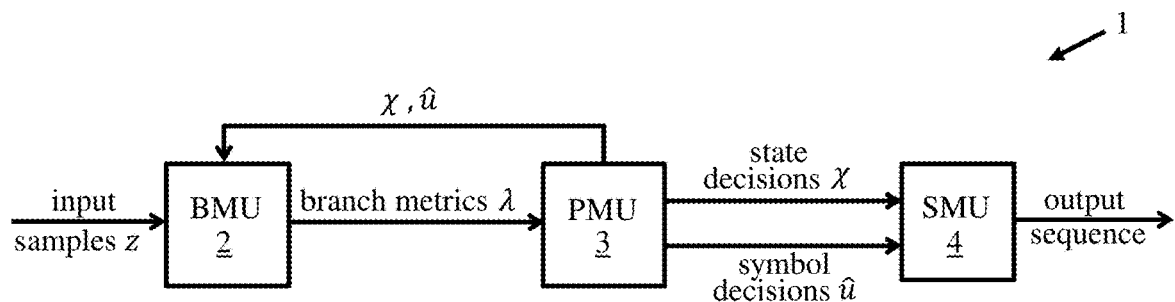
FIG. 1 is a schematic block diagram of a sequence detector.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 is a schematic block diagram of a sequence detector indicating basic detector structure and operation. The sequence detector 1 receives a sequence of samples of an analog signal which has been modulated with a symbol sequence at a channel input, transmitted over the channel and sampled at the channel output. The detector implements a recursive algorithm for detecting the most-probable symbol sequence at the channel input. The Viterbi algorithm is commonly used as the recursive method here. In the embodiments described below, detector 1 uses the Viterbi algorithm to implement a Viterbi detector.

The detector 1 comprises a branch metric unit (BMU) 2, a path metric unit (PMU) 3 and a survivor memory unit (SMU) 4. The BMU 2 receives successive input samples z and calculates, for each input sample, branch metrics associated with possible transitions between states $\chi$ of a trellis as explained in detail below. The PMU 3 receives branch metrics $\lambda$ for each sample from BMU 2. Based on the branch metrics for successive samples, the PMU calculates path metrics for respective survivor paths to each state of the trellis and selects, for each state, a latest symbol value $\hat{u}$ in the survivor path to that state. This involves, for each input sample z, updating of previous path metrics by addition of current branch metrics to obtain partial path metrics for each state, and then selecting an optimum (e.g. smallest) path metric from the partial path metrics for each state. The optimum path metric for each state corresponds to the most likely path to that state. This optimum path metric thus decides the preceding state $\chi$ in the current survivor path to the state, and also the latest symbol value $\hat{u}$ in that survivor path. The state decisions $\chi$ and symbol decisions $\hat{u}$ are output to SMU 4 which stores the symbol decisions for the survivor paths. (In some embodiments, the state decisions χ and symbol decisions û are also fed back to BMU 2 for use in selection of hypothesized symbol values as explained below). At the end of the input sample sequence, the SMU 4 selects an optimum (most likely) one of the survivor paths for the sequence, e.g. the survivor path with the smallest path metric. This optimum path defines the symbol sequence output by SMU 4 and corresponds to the most-likely sequence of symbols at the channel input.

The component units 2, 3 and 4 of detector 1 are implemented as a series of pipeline stages which process input samples in a succession of time-steps $k=0, 1, \ldots, (K-1)$ corresponding to a sequence of K samples $z_k$ produced at the channel output. An ISI channel has a discrete-time impulse response with L+1 channel coefficients where L>0. In particular, the channel is modelled by its discrete-time impulse-response sequence $h=(h_0, h_1, \ldots, h_L)$ where L is the number of interfering channel coefficients (channel memory). For a symbol $u_k$ input to the channel at time k, the corresponding channel output $y_k$ can be expressed as $y_k = \sum_{i=0}^{L} h_i u_{k-i}$ and is thus a function of $u_k$ and the L previous symbols $u_{k-1}$ to $u_{k-L}$. This output is corrupted by additive white Gaussian noise $w_k$, whereby the resulting input sample at detector 1 is given by $z_k = y_k + w_k$.

The BMU 2 receives the input samples $z_k$ and also receives the channel coefficient vector $h=(h_0, h_1, \ldots, h_L)$ described above. For each input sample $z_k$, branch metrics $\lambda_k$ are calculated based on the difference between the input sample and a set of hypothesized sample values, denoted here by $\tilde{y}_k$, calculated for each possible transition between states $\chi_k$, $\chi_{k+1}$ of the trellis. For example, with two post-cursor per-survivor decision-feedback taps $\{h_1, h_2\}$, i.e. L=2, the hypothesized sample values $\tilde{y}_k$ are calculated by taking the inner product of the symbols $\hat{u}_{k-1}$, $\hat{u}_{k-2}$ in each survivor path with the post-cursor discrete-time channel impulse-response sequence $\{h_1, h_2\}$ and adding $h_0 u_k$ to the result:

$$\tilde{y}_k = u_k + h_1 \hat{u}_{k-1} + h_2 \hat{u}_{k-2} \forall u_k \in \mathbb{A}$$

where $\mathbb{A}$ is the symbol constellation of the transmission scheme and we assume here, without loss of generality, that the main-cursor tap $h_0=1$. The hypothesized sample values $\tilde{y}_k$ are what the input sample $z_k$ would be for certain permutations of transmitted input symbols $\{u_k, u_{k-1}, u_{k-2}\}$ in the absence of noise.

The symbol $u_k$, transmitted in time-step k, determines the state $\chi_{k+1}$ of a survivor path at the end of that time-step. For example, in a trellis with two states $\chi=0$ and $\chi=1$, there are four possible transitions $(\chi_k, \chi_{k+1})$ at time-step k, i.e., (0, 0), (0, 1), (1, 0) and (1, 1). For each of these transitions, there will be a number of hypothesized sample values $\tilde{y}_k^j$, $j=0, 1, \ldots$, depending on the number of possible permutations of symbol values in $\sum_{i=0}^{L} h_i u_{k-i}$ for the path terminating in that transition. This is explained in more detail below. For each sample $z_k$ and each transition $(\chi_k, \chi_{k+1})$, the BMU 2 calculates distance values, denoted here by $d_k^j$, indicative of distance between that sample and respective hypothesized sample values $\tilde{y}_k^j$ for that transition. Various distance metrics, such as Euclidean distance or squared Euclidean distance, may be used here. In the preferred embodiments below, each distance value $d_k^j$, is calculated as the modulus of the difference between the sample and the respective hypothesized sample value:

$$d_k^j(\chi_k, \chi_{k+1}) = |z_k - \tilde{y}_k^j(\chi_k, \chi_{k+1})| \quad (1)$$

The branch metric $\lambda(\chi_k, \chi_{k+1})$ for each transition is selected as the optimum (here smallest) distance value for that transition:

$$\lambda_k(\chi_k, \chi_{k+1}) = \min_j d_k^j(\chi_k, \chi_{k+1}) \quad (2)$$

The index of the selected distance value is thus given by:

$$d_k^{argmin} = \mathrm{argmin}_j d_k^j(\chi_k, \chi_{k+1}) \quad (3)$$

Figure 2:
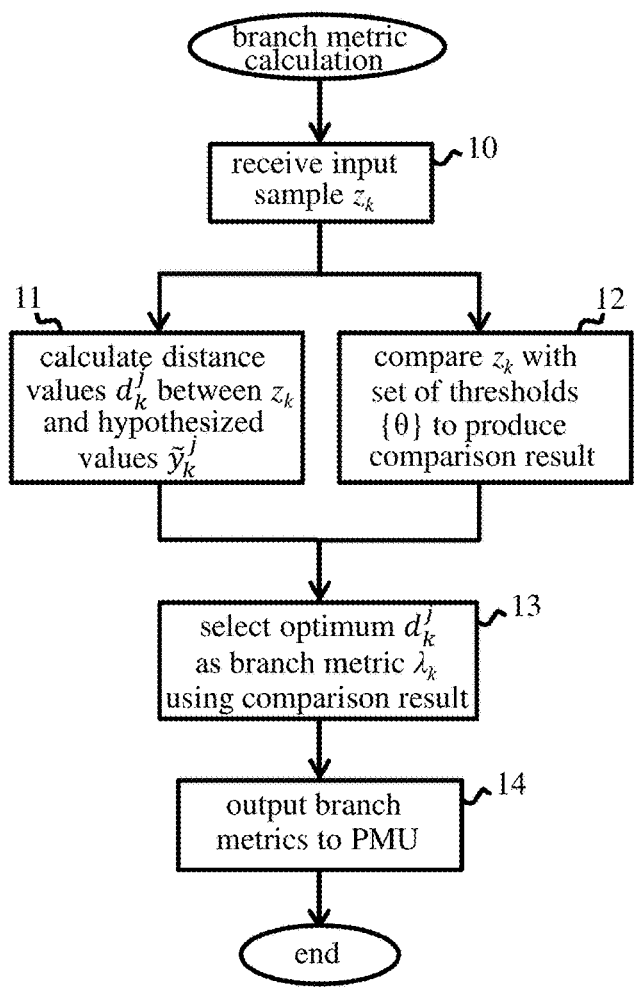
FIG. 2 indicates steps performed in the FIG. 1 detector by a branch metric unit embodying the invention.

In a conventional BMU, the distance values for a given transition are first calculated, and the resulting distance values are then compared to identify the minimum value which is selected as the branch metric. In contrast, FIG. 2 illustrates the branch metric calculation method performed by BMU 2 embodying the invention. (Note that steps of this diagram do not correspond to steps of the pipelined operation described above. In general, the branch metric calculation may be performed over one or more time-steps of the pipelined operation). An input sample $z_k$ is received by BMU 2 in step 10. As indicated schematically in the figure, the following steps 11 and 12 are performed in parallel in the BMU. In step 11, the BMU calculates the distance values $d_k^j$ according to Equation (1) above. In parallel with calculation of the distance values, in step 12 the BMU compares the sample $z_k$ with a predetermined set of (one or more) thresholds $\{\theta\}$ to produce a comparison result. Each threshold is defined between a pair of successive hypothesized sample values $\tilde{y}_k^j$ arranged in value order as explained further below. Next, in step 13, the BMU 2 selects an optimum distance value $d_k^j$ as a branch metric $\lambda_k$ for each transition in dependence on the comparison result from step 12. In this example, the minimum distance value $d_k^j(\chi_k, \chi_{k+1})$ is selected as the branch metric in accordance with Equation (2) above. In step 14, the BMU outputs the branch metrics $\lambda_k(\chi_k, \chi_{k+1})$ for each transition to PMU 3, and operation is complete for the current input sample.

By comparing the input sample with the thresholds (step 12) in parallel with the distance calculation (step 11), the implementation complexity, power consumption, and propagation delay of the BMU can all be reduced compared to a conventional BMU implementation. The comparison operation is performed directly with the input sample instead of the distance metric calculated in the BMU. In doing so, the propagation delay of one comparator can be eliminated from the longest path of the BMU, and the total number of comparators required for level discrimination can be reduced. The branch metric calculation method does not require additional pipeline stages, so no extra latency is incurred. Embodiments of the invention thus offer a significant increase in speed of the branch metric calculation.

Particular embodiments of BMU 2 are described in more detail below for two transmission schemes: uncoded 4-PAM (four-level pulse-amplitude modulation) and 4-D (four-dimensional) 5-PAM TCM (Trellis Coded Modulation) with eight states. The PMU 3 and SMU 4 of detector 1 can be implemented in conventional manner for these embodiments. The various circuit elements of the embodiments described can be implemented by hard-wired logic circuits of generally known form. In general, however, functionality of components can be implemented in hardware or software or a combination thereof.

The following notation will be used:

$\mathbb{A}$ the signal constellation;
$\mathbb{A}$ (i) information symbol in $\mathbb{A}$ : $i \in \mathbb{Z}$, $0 \leq i \leq |\mathbb{A}|$;
$\mathbb{A}_s$ subset in $\mathbb{A}$ : $s \in \{0,1\}$, $\mathbb{A}_0 \cap \mathbb{A}_1 = 0$, $\mathbb{A}_0 \cup \mathbb{A}_1 = \mathbb{A}$, and intra-subset Euclidean distance is maximized;
$u_k$ transmitted symbol at time k, $u_k \in \mathbb{A}$;
$\chi_k$ state at time k.

Figure 3:
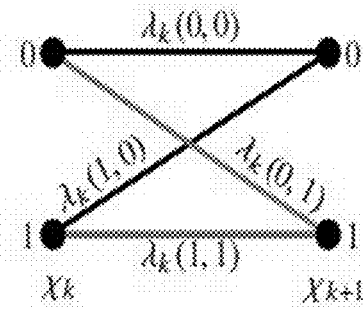
FIG. 3 shows a reduced-state trellis in a first embodiment of the sequence detector.

In the first embodiment, the sequence detector 1 is a reduced-state sequence detector (RSSD), and BMU 2 calculates branch metrics for transitions between states (also known as "substates") of a reduced-state trellis. The reduced-state trellis is constructed via mapping by set partitioning. The symbol constellation $\mathbb{A}$ used in the transmission scheme is partitioned into subsets, and the subset to which a symbol $u_k$, transmitted in time-step k, belongs determines the state $\chi_{k+1}$ of a survivor path at the end of that time-step. In this example, the BMU 2, PMU 3 and SMU 4 of RSSD 1 collectively implement a two-state 4-PAM Viterbi detector. The discrete-time channel impulse-response sequence is taken as $h=(1, h_1)$ with $|h_1|<1$. A symbol $u_k$ transmitted over the channel at time $k \in \{0, 1, \ldots, K-1\}$ is drawn from a 4-PAM signal constellation $\mathbb{A}$ containing four symbols centered on the origin: $\mathbb{A} = \{-3, 1, 1, 3\}$, whereby $\mathbb{A}(0)=-3$, $\mathbb{A}(1)=-1$, $\mathbb{A}(2)=1$, and $\mathbb{A}(3)=3$. The constellation is partitioned into two subsets $\mathbb{A}_0 = \{\mathbb{A}(0), \mathbb{A}(2)\} = \{-3, 1\}$, and $\mathbb{A}_1 = \{\mathbb{A}(1), \mathbb{A}(3)\} = \{-1, 3\}$ such that the intra-subset Euclidean distance is maximized. The reduced-state subset trellis has two states $\chi=0$ and $\chi=1$. The subset to which the symbol $u_k$ belongs determines the state $\chi_{k+1}$ at time $k+1$ according to: $\chi_{k+1}=0$ if $u_k \in \mathbb{A}_0$ and $\chi_{k+1}=1$ if $u_k \in \mathbb{A}_1$. FIG. 3 shows the reduced-state trellis for this embodiment indicating the branch metrics $\lambda_k(\chi_k, \chi_{k+1})$ corresponding to the four possible transitions between states $\chi_k$ and $\chi_{k+1}$.

The BMU 2 comprises four component units (sub-BMUs) for calculating the branch metrics $\lambda_k(0,0)$, $\lambda_k(0,1)$, $\lambda_k(1,0)$, $\lambda_k(1,1)$ respectively for the four possible transitions in the reduced-state trellis of FIG. 3. The BMU operation can be understood from the following description of operation of the sub-BMU for calculating $\lambda_k(0,0)$.

Figure 4:
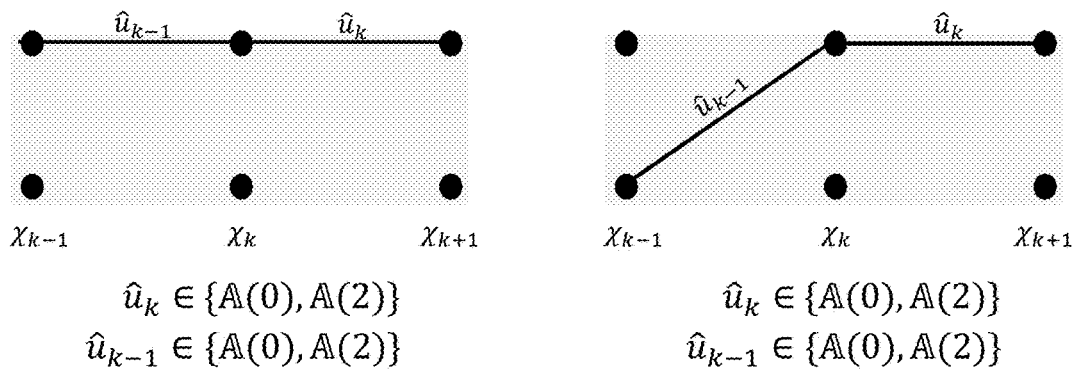
FIG. 4 shows transitions in the reduced-state trellis for a branch metric calculation in a branch metric unit of the first embodiment.

For the $\chi_k=0$ to $\chi_{k+1}=0$ transition, the possible trellis transitions for $\{u_k, u_{k-1}\}$ are shown in FIG. 4. Since $\chi_k=0$ and $\chi_{k+i}=0$, $\hat{u}_{k-1} \in \mathbb{A}_0 = \{\mathbb{A}(0), \mathbb{A}(2)\}$ and $\hat{u}_k \in \mathbb{A}_0 = \{\mathbb{A}(0), \mathbb{A}(2)\}$. There are four hypothesized sample values $\tilde{y}_k^j(0,0) = \hat{u}_k + h_1 \hat{u}_{k-1}$ as follows:

$$\tilde{y}_k^0(0,0) = \mathbb{A}(0) + h_1 \mathbb{A}(0);$$

$$\tilde{y}_k^1(0,0) = \mathbb{A}(0) + h_1 \mathbb{A}(2);$$

$$\tilde{y}_k^2(0,0) = \mathbb{A}(2) + h_1 \mathbb{A}(0);$$

$$\tilde{y}_k^3(0,0) = \mathbb{A}(2) + h_1 \mathbb{A}(2). \quad (4)$$

When $0<h_1<1$, the intervals of the hypothesized sample values $\tilde{y}_k^j(0,0)$ are as follows:

$$\tilde{y}_k^0(0,0) \in (2\mathbb{A}(0), \mathbb{A}(0));$$

$$\tilde{y}_k^1(0,0) \in (\mathbb{A}(0), \mathbb{A}(0)+\mathbb{A}(2));$$

$$\tilde{y}_k^2(0,0) \in (\mathbb{A}(0),+\mathbb{A}(2), \mathbb{A}(2));$$

$$\tilde{y}_k^3(0,0) \in (\mathbb{A}(2), 2\mathbb{A}(2)).$$

Therefore, the hypothesized sample values can be arranged in value order as follows:

$$\tilde{y}_k^0(0,0) < \tilde{y}_k^1(0,0) < \tilde{y}_k^2(0,0) < \tilde{y}_k^3(0,0). \quad (5)$$

Figure 5:
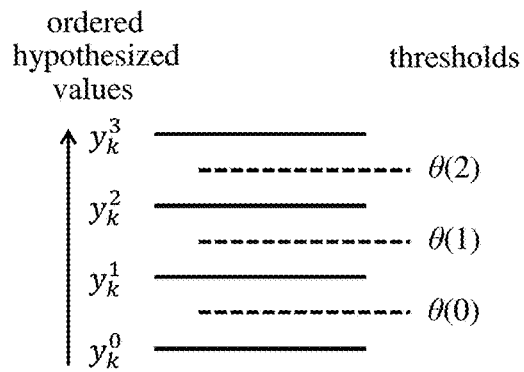
FIG. 5 indicates thresholds used in the branch metric unit of the first embodiment.

The set of thresholds $\{\theta\}$ used in step 12 of FIG. 2 for the (0, 0) transition contains three thresholds $\theta(0)$, $\theta(1)$ and $\theta(2)$ as illustrated schematically in FIG. 5. Each threshold is defined between a pair of successive hypothesized sample values $\tilde{y}_k^j(0,0)$ arranged in value order. In the preferred embodiment here, each threshold is defined as halfway between a pair of successive hypothesized values $\tilde{y}_k^j(0,0)$ as indicated. The thresholds are therefore defined as follows:

$$\theta(0) = \mathbb{A}(0) + h_1\left(\frac{\mathbb{A}(0)+\mathbb{A}(2)}{2}\right) \quad (6)$$

$$\theta(1) = (1+h_1)\left(\frac{\mathbb{A}(0)+\mathbb{A}(2)}{2}\right) \text{ and}$$

$$\theta(2) = \mathbb{A}(2) + h_1\left(\frac{\mathbb{A}(0)+\mathbb{A}(2)}{2}\right).$$

The distance values $d_k^j(0,0)$ are calculated in step 11 of FIG. 2 in accordance with Equation (1) above as:

$$d_k^0(0,0) = |z_k - \tilde{y}_k^0(0,0)|$$

$$d_k^1(0,0) = |z_k - \tilde{y}_k^1(0,0)|$$

$$d_k^2(0,0) = |z_k - \tilde{y}_k^2(0,0)|$$

$$d_k^3(0,0) = |z_k - \tilde{y}_k^3(0,0)|$$

These distance values effectively constitute the "candidate branch metrics" from which the optimum (here minimum) value will be selected as the final branch metric $\lambda_k(0,0)$ in accordance with Equation (2) above. The index j of this minimum distance value $d_k^j(0,0)$ is thus determined by the index j of the hypothesized sample value $\tilde{y}_k^j(0,0)$ to which $z_k$ is closest. It can be seen from FIG. 5 that the position of $z_k$ in relation to the thresholds $\theta(0)$, $\theta(1)$ and $\theta(2)$ indicates the value $\tilde{y}_k^j(0,0)$ to which $z_k$ is closest, and hence determines the optimum branch metric (for $0<h_1<1$), as follows:

$$\lambda_k(0,0) = \begin{cases} d_k^0(0,0), & \text{if } z_k \le \theta(0) \\ d_k^1(0,0), & \text{if } \theta(0) < z_k \le \theta(1) \\ d_k^2(0,0), & \text{if } \theta(1) < z_k \le \theta(2) \\ d_k^3(0,0), & \text{if } z_k > \theta(2) \end{cases} \quad (7)$$

The optimum branch metric $\lambda_k(0,0)$ can thus be determined by solving these equations simultaneously.

Similarly, when $-1<h_1<0$, the intervals of the hypothesized sample values $\tilde{y}_k^j(0,0)$ are as follows:

$$\tilde{y}_k^1(0,0) \in (\mathbb{A}(0) - \mathbb{A}(2), \mathbb{A}(0));$$

$$\tilde{y}_k^0(0,0) \in (\mathbb{A}(0), 0);$$

$$\tilde{y}_k^3(0,0) \in (0, \mathbb{A}(2));$$

$$\tilde{y}_k^2(0,0) \in (\mathbb{A}(2), \mathbb{A}(2) - \mathbb{A}(0));$$

Therefore, the hypothesized sample values can be ordered as follows:

$$\tilde{y}_k^1(0,0) < \tilde{y}_k^0(0,0) < \tilde{y}_k^3(0,0) < \tilde{y}_k^2(0,0).$$

The thresholds $\theta(0)$, $\theta(1)$ and $\theta(2)$ calculated for this ordering of the hypothesized values are the same as in Equation set (6) above. Hence, the optimum branch metric $\lambda_k(0,0)$ for $-1<h_1<0$ is given by:

$$\lambda_k(0,0) = \begin{cases} d_k^1(0,0), & \text{if } z_k \le \theta(0) \\ d_k^0(0,0), & \text{if } \theta(0) < z_k \le \theta(1) \\ d_k^3(0,0), & \text{if } \theta(1) < z_k \le \theta(2) \\ d_k^2(0,0), & \text{if } z_k > \theta(2) \end{cases} \quad (8)$$

Figure 6:
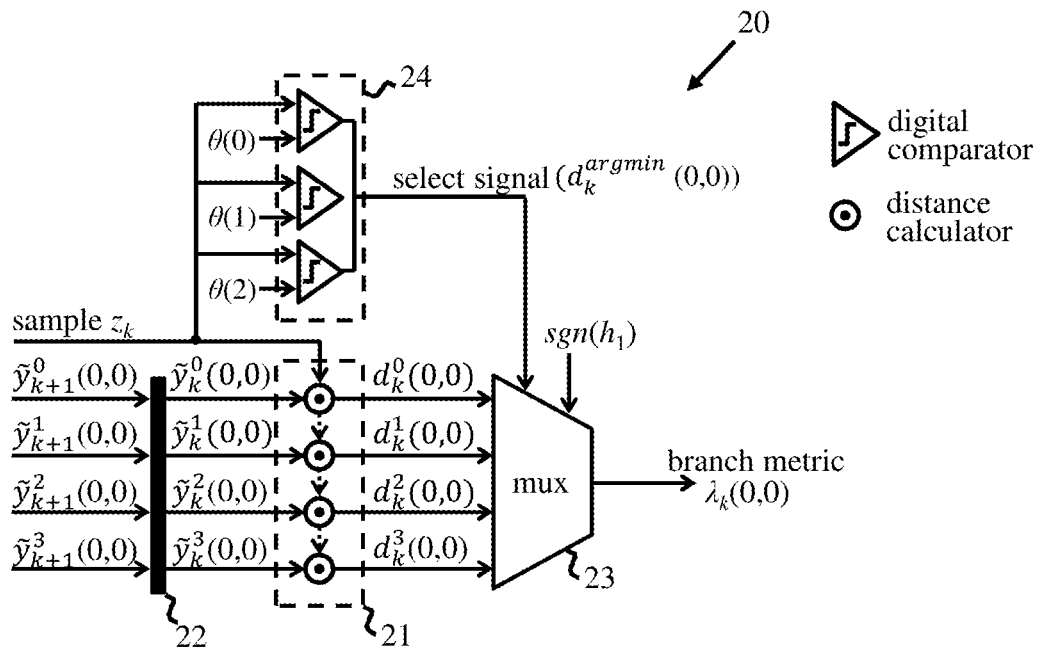
FIG. 6 illustrates a component of the branch metric unit in the first embodiment.

FIG. 6 indicates structure of the sub-BMU for calculating $\lambda_k(0,0)$ in this embodiment. The sub-BMU 20 includes distance calculation logic comprising four distance calculators, indicated generally at 21, which receive respective hypothesized sample values $\tilde{y}_k^j(0,0)$. The hypothesized sample values $\tilde{y}_k^j(0,0)$ can be calculated in real time, in accordance with Equation set (4) above, by calculation logic (not shown) of BMU 2. The hypothesized sample values are calculated in advance, by one clock-period of the pipelined BMU operation, as values $\tilde{y}_{k+1}^j(0, 0)$ which are supplied to pipeline register 22 and output as $\tilde{y}_k^j(0, 0)$ to respective distance calculators 21 at the start of the next clock period. Each distance calculator 21 also receives the current input sample $z_k$ and calculates a respective distance value $d_k^j(0, 0)$ in accordance with Equation (1) above. The distance values $d_k^j(0, 0)$ are output to selection logic implemented by multiplexer (mux) 23.

The sub-BMU 20 also includes comparison logic comprising three comparators, indicated generally at 24, connected in parallel with the distance calculation logic 21. A first input of each comparator receives a respective threshold value $\theta(0)$, $\theta(1)$ or $\theta(2)$. The second input of each comparator receives the input sample $z_k$. Each comparator produces a 1-bit output whose value indicates whether or not the input sample $z_k$ exceeds the respective threshold. The three comparator output bits collectively constitute a select signal, indicating the result of the threshold comparison, which is supplied to a control input of multiplexer 23. The 3-bits of the select signal map to $d_k^{argmin}$ in Equation (3) above, i.e. the index j of the minimum distance value $d_k^j(0, 0)$ to be selected as the optimum branch metric $\lambda_k(0, 0)$. This mapping, defined by Equation set (7) or (8) above, depends on whether the coefficient $h_1$ is positive or negative. Hence, a 1-bit signal $sgn(h_1)$, indicating the sign of $h_1$, is supplied to a further control input of multiplexer 23 as indicated. Based on these control inputs, multiplexer 23 selects the optimum distance value $d_k^j(0, 0)$ input from distance calculators 21 and outputs this value as the branch metric $\lambda_k(0, 0)$.

The following example illustrates operation of sub-BMU 20 for the 4-PAM signal constellation $\mathbb{A} = \{-3, 1, 1, 3\}$ with a discrete-time channel impulse-response sequence h=(1, 0.6). The hypothesized input values are:

$\tilde{y}_k^0(0,0) = -3-3h_1 = -4.8$;

$\tilde{y}_k^1(0,0) = -3+h_1 = -2.4$;

$\tilde{y}_k^2(0,0) = 1-3h_1 = -0.8$;

$\tilde{y}_k^3(0,0) = 1+h_1 = 1.6$.

The distance values are:

$d_k^0(0,0) = |z_k + 4.8|$;

$d_k^1(0,0) = |z_k + 2.4|$;

$d_k^2(0,0) = |z_k + 0.8|$;

$d_k^3(0,0) = |z_k - 1.6|$.

The thresholds are:

$\theta(0) = \mathbb{A}(0) + h_1\left(\frac{\mathbb{A}(0)+\mathbb{A}(2)}{2}\right) = -3.6$;

$\theta(1) = (1 + h_1)\left(\frac{\mathbb{A}(0)+\mathbb{A}(2)}{2}\right) = -1.6$;

$\theta(2) = \mathbb{A}(2) + h_1\left(\frac{\mathbb{A}(0)+\mathbb{A}(2)}{2}\right) = 0.4$.

The branch metric is calculated as:

$$\lambda_k(0, 0) = \begin{cases} |z_k + 4.8|, & \text{if } z_k \leq -3.6 \\ |z_k + 2.4|, & \text{if } -3.6 < z_k \leq -1.6 \\ |z_k + 0.8|, & \text{if } -1.6 < z_k \leq 0.4 \\ |z_k - 1.6|, & \text{if } z_k > 0.4 \end{cases}$$

Figure 7:
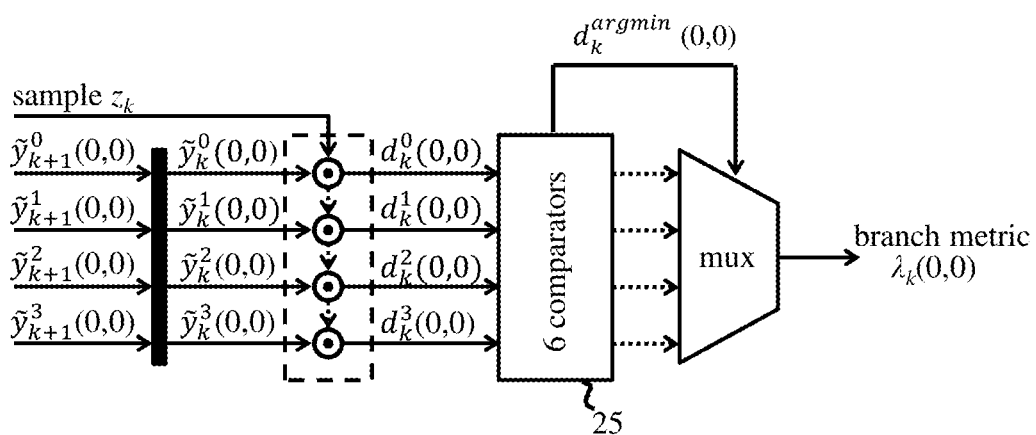
FIG. 7 shows a corresponding component of a conventional branch metric unit.

It can be seen from FIG. 6 that the propagation delay of sub-BMU 20 is the sum of that of a distance calculator and a 4-to-1 multiplexer. By comparison, the structure of a corresponding sub-unit for calculating $\lambda_k(0, 0)$ in a conventional BMU is shown in FIG. 7. Here, the distance values $d_k^j(0, 0)$ are supplied to inputs of six comparators, indicated generally at 25, which respectively compare the six possible pairs of the four distance values to determine which distance value is smallest. The result of this comparison determines selection of the branch metric $\lambda_k(0, 0)$. The propagation delay of this unit is the sum of that of a distance calculator, a digital comparator and a 4-to-1 multiplexer. The FIG. 6 embodiment thus eliminates the propagation delay of one comparator from the BMU operation. (The propagation delay of a comparator 24 is typically less than that of a distance calculator, particularly in advanced technology nodes such as 14 nm CMOS, and thus does not contribute any additional delay in the FIG. 6 structure). In addition, the number of comparators required in the FIG. 6 structure is reduced by three.

The BMU 2 contains three further sub-BMUs for calculating the branch metrics $\lambda_k(0, 1)$, $\lambda_k(1, 0)$ and $\lambda_k(1, 1)$. The structure and operation of these sub-BMUs corresponds directly to that of the FIG. 6 unit using the appropriate hypothesized values and thresholds in each case. For completeness, the equation sets corresponding to Equations (4) to (7) above for each further sub-BMU are given below for $0 < h_1 < 1$. (The corresponding equations for $-1 < h_1 < 0$ can be readily derived according to the principles above).

Sub-BMU for $\lambda_k(0,1)$
Hypothesized sample values:

$\tilde{y}_k^0(0,1) = \mathbb{A}(1) + h_1 \mathbb{A}(0)$;

$\tilde{y}_k^1(0,1) = \mathbb{A}(1) + h_1 \mathbb{A}(2)$;

$\tilde{y}_k^2(0,1) = \mathbb{A}(3) + h_1 \mathbb{A}(0)$;

$\tilde{y}_k^3(0,1) = \mathbb{A}(3) + h_1 \mathbb{A}(2)$.

Ordering of hypothesized sample values:

$\tilde{y}_k^0(0,1) < \tilde{y}_k^1(0,1) < \tilde{y}_k^2(0,1) < \tilde{y}_k^3(0,1)$ Thresholds:

$\theta(0) = \mathbb{A}(1) + h_1\left(\frac{\mathbb{A}(0)+\mathbb{A}(2)}{2}\right)$;

$\theta(1) = \left(\frac{\mathbb{A}(1)+\mathbb{A}(3)}{2}\right) + h_1\left(\frac{\mathbb{A}(0)+\mathbb{A}(2)}{2}\right)$;

$\theta(2) = \mathbb{A}(3) + h_1\left(\frac{\mathbb{A}(0)+\mathbb{A}(2)}{2}\right)$.

Branch metric selection:

$$\lambda_k(0, 1) = \begin{cases} d_k^0(0, 1), & \text{if } z_k \leq \theta(0) \\ d_k^1(0, 1), & \text{if } \theta(0) < z_k \leq \theta(1) \\ d_k^2(0, 1), & \text{if } \theta(1) < z_k \leq \theta(2) \\ d_k^3(0, 1), & \text{if } z_k > \theta(2) \end{cases}$$

Sub-BMU for $\lambda_k(1, 0)$
Hypothesized sample values:

$\tilde{y}_k^0(1,0) = \mathbb{A}(0) + h_1 \mathbb{A}(1)$;

$\tilde{y}_k^1(1,0) = \mathbb{A}(0) + h_1 \mathbb{A}(3)$;

$\tilde{y}_k^2(1,0) = \mathbb{A}(2) + h_1 \mathbb{A}(1)$;

$\tilde{y}_k^3(1,0) = \mathbb{A}(2) + h_1 \mathbb{A}(3)$.

Ordering of hypothesized sample values:

$$\tilde{y}_k^0(1,0) < \tilde{y}_k^1(1,0) < \tilde{y}_k^2(1,0) < \tilde{y}_k^3(1,0)$$

Thresholds:

$$\theta(0) = \mathbb{A}(0) + h_1\left(\frac{\mathbb{A}(1) + \mathbb{A}(3)}{2}\right);$$

$$\theta(1) = \left(\frac{\mathbb{A}(0) + \mathbb{A}(2)}{2}\right) + h_1\left(\frac{\mathbb{A}(1) + \mathbb{A}(3)}{2}\right);$$

$$\theta(2) = \mathbb{A}(2) + h_1\left(\frac{\mathbb{A}(1) + \mathbb{A}(3)}{2}\right).$$

Branch metric selection:

$$\lambda_k(1,0) = \begin{cases} d_k^0(1,0), & \text{if } z_k \leq \theta(0) \\ d_k^1(1,0), & \text{if } \theta(0) < z_k \leq \theta(1) \\ d_k^2(1,0), & \text{if } \theta(1) < z_k \leq \theta(2) \\ d_k^3(1,0), & \text{if } z_k > \theta(2) \end{cases}$$

Sub-BMU for $\lambda_k(1,1)$

Hypothesized sample values:

$$\tilde{y}_k^0(1,1) = \mathbb{A}(1) + h_1 \mathbb{A}(1);$$

$$\tilde{y}_k^1(1,1) = \mathbb{A}(1) + h_1 \mathbb{A}(3);$$

$$\tilde{y}_k^2(1,1) = \mathbb{A}(3) + h_1 \mathbb{A}(1);$$

$$\tilde{y}_k^3(1,1) = \mathbb{A}(3) + h_1 \mathbb{A}(3).$$

Ordering of hypothesized sample values:

$$\tilde{y}_k^0(1,1) < \tilde{y}_k^1(1,1) < \tilde{y}_k^2(1,1) < \tilde{y}_k^3(1,1)$$

Thresholds:

$$\theta(0) = \mathbb{A}(1) + h_1\left(\frac{\mathbb{A}(1) + \mathbb{A}(3)}{2}\right);$$

$$\theta(1) = (1 + h_1)\left(\frac{\mathbb{A}(1) + \mathbb{A}(3)}{2}\right);$$

$$\theta(2) = \mathbb{A}(3) + h_1\left(\frac{\mathbb{A}(1) + \mathbb{A}(3)}{2}\right).$$

Branch metric selection:

$$\lambda_k(1,1) = \begin{cases} d_k^0(1,1), & \text{if } z_k \leq \theta(0) \\ d_k^1(1,1), & \text{if } \theta(0) < z_k \leq \theta(1) \\ d_k^2(1,1), & \text{if } \theta(1) < z_k \leq \theta(2) \\ d_k^3(1,1), & \text{if } z_k > \theta(2) \end{cases}$$

With four sub-BMU's as described above, a total of twelve comparators are eliminated from the 2-state 4-PAM RSSD compared to a conventional implementation, significantly reducing both the implementation complexity and power consumption. In general, implementation complexity and power consumption increase with both number of states in the trellis and number of time steps for which the BMU calculates branch metrics in parallel. An N-step BMU contains N parallel BMU units which calculate the branch metrics for N input samples $z_k$ in parallel. For a 2-step 2-state RSSD, for instance, the implementation complexity of the BMU is at least doubled compared to the 1-step 2-state embodiment above, whereby 24 comparators can be eliminated. Typically, $1 \leq N \leq 16$ for a 2-substate 4-PAM Viterbi detector, and the saving increases dramatically with higher values of N.

In the FIG. 6 embodiment, selection of the optimum distance value in multiplexer 23 depends on both the select signal and the sign of channel coefficient $h_1$. The BMU operation can be readily adapted to accommodate a channel impulse response with additional interfering channel coefficients $h_2, h_3, \ldots$, etc., and appropriate modifications will be readily apparent to those skilled in the art. More than four hypothesized sample values $\tilde{y}_k^j$ may be calculated as appropriate in these embodiments, and selection of hypothesized values $\tilde{y}_k^j$ for the distance calculation in the sub-BMUs may depend on state decisions $\chi$ and symbol decisions $\hat{u}$ fed back from the PMU 3 (FIG. 1) in known manner. In particular, these feedback decisions can be used to select, from all possible hypothesized values $\tilde{y}_k^j$ for a transition, those values which are consistent with known transitions earlier in the survivor path through the trellis. In general, for a channel having an impulse response with L>0 interfering channel coefficients, the optimum distance value will be selected as the branch metric in each sub-BMU in dependence on the result of the threshold comparison result, and the sign of each channel coefficient $h_1, h_2, \ldots$, etc., in accordance with the principles described above. Also, while the hypothesized sample values are calculated in real time in the embodiment above, in other embodiments these values may be precalculated and stored, e.g. in a register array of BMU 2, for use as required.

Figure 8:
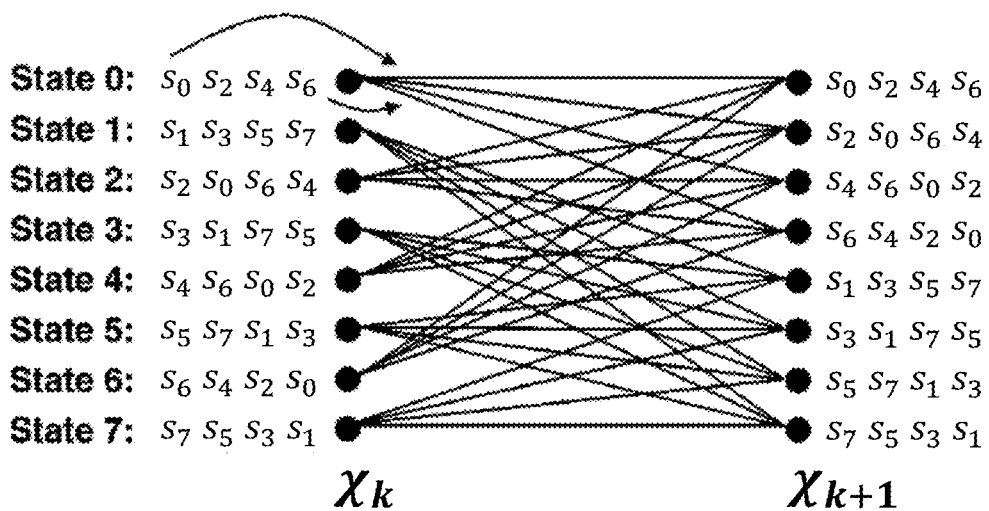
FIG. 8 shows a trellis in a second embodiment of the sequence detector.

In the second embodiment, the sequence detector 1 is a full-state detector and the BMU 2, PMU 3 and SMU 4 collectively implement an eight-state 4-D 5-PAM Viterbi detector. The 5-PAM signal constellation $\mathbb{A} = \{-2, 1, 0, 1, 2\}$ contains five symbols: $\mathbb{A}(0)=-2$, $\mathbb{A}(1)=-1$, $\mathbb{A}(2)=0$, $\mathbb{A}(3)=1$ and $\mathbb{A}(4)=2$. With this 4-D transmission scheme, four 1-D symbols $u_k$ are transmitted in parallel and a 4-D sample, consisting of four 1-D samples $z_k$, is received at the detector input. The signal constellation $\mathbb{A}$ is partitioned into two subsets $\mathbb{A}_0 = \{\mathbb{A}(0), \mathbb{A}(2), \mathbb{A}(4)\}$, and $\mathbb{A}_1 = \{\mathbb{A}(1), \mathbb{A}(3)\}$. This results in 16 different 4-D subsets $\{(\mathbb{A}_0, \mathbb{A}_0, \mathbb{A}_0, \mathbb{A}_0), (\mathbb{A}_0, \mathbb{A}_0, \mathbb{A}_0, \mathbb{A}_1), \ldots, (\mathbb{A}_1, \mathbb{A}_1, \mathbb{A}_1, \mathbb{A}_1)\}$. By uniting a 4-D subset and its complement, e.g., $(\mathbb{A}_0, \mathbb{A}_1, \mathbb{A}_0, \mathbb{A}_1)$ and $(\mathbb{A}_1, \mathbb{A}_0, \mathbb{A}_1, \mathbb{A}_0)$, eight new 4-D subsets $\{s_0, s_1, \ldots, s_7\}$ are obtained such that the 4-D intrasubset Euclidean distance remains constant. The radix-4 trellis diagram for this embodiment has eight states $\chi=0$ to 7 as shown in FIG. 8. Transitions are labeled according to the subset $s_0, s_1, \ldots, s_7$ of the 4-D symbol transmitted in time step k. The four transitions from each even-numbered state $\chi_k$ are labeled, in order from the top to the bottom transition line, either $s_0, s_2, s_4$ or $s_6$ in the left-to-right order indicated next to each state. The four transitions from each odd-numbered state $\chi_k$ are labeled, in order from the top to the bottom line, either $s_1, s_3, s_5$ or $s_7$ in the left-to-right order indicated next to each state. This gives corresponding labelling for transitions to each of the eight states $\chi_{k+1}$ as indicated next to those states.

The 4-D branch metrics for each trellis transition are obtained by first calculating 1-D branch metrics for each of the four 1-D samples $z_k(l)$, where $l \in \{0, 1, 2, 3\}$ denotes dimension, supplied to the detector input. In this embodiment, steps 10 to 13 of the FIG. 2 process are applied for calculation of the 1-D branch metrics. For simplicity, operation will be described for a discrete-time channel impulse-response sequence h=(1).

Each 1-D sample $z_k(l)$ corresponds to a 1-D symbol $u_k$ in either subset $\mathbb{A}_0$ or subset $\mathbb{A}_1$. The BMU calculates a 1-D branch metric for each sample $z_k(l)$ and each subset $\mathbb{A}_0$ and $\mathbb{A}_1$. The 1-D branch metric for subset $\mathbb{A}_0$ and dimension 1 is denoted here by $\lambda_k(\mathbb{A}_0, 1)$. The 1-D branch metric for subset $\mathbb{A}_1$ and dimension 1 is denoted by $\lambda_k(\mathbb{A}_1, 1)$. The BMU comprises four sub-BMUs, one for each dimension 1, each containing component units shown in FIGS. 9 and 10.

Figure 9:
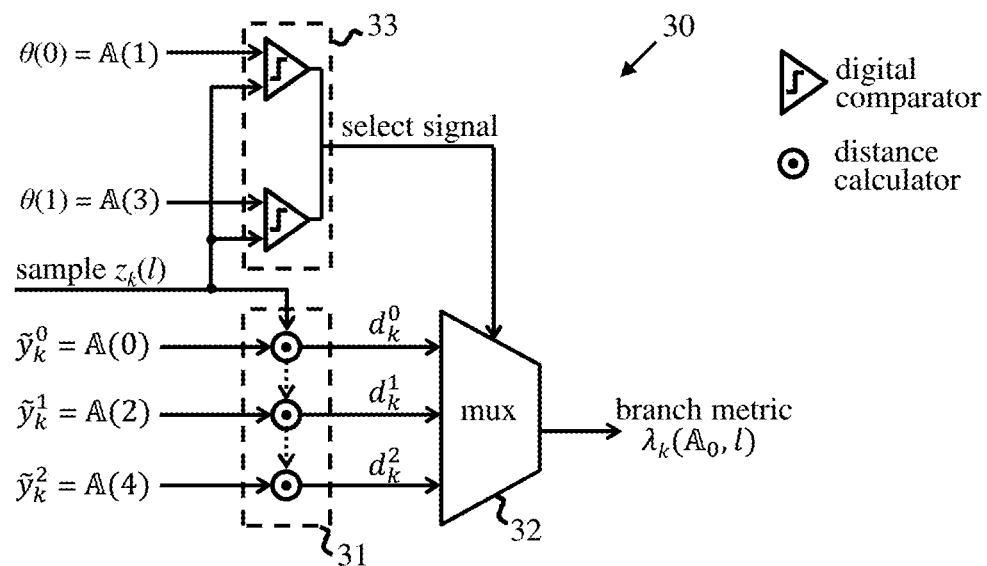
FIGS. 9 and 10 illustrate components of a branch metric unit in the second embodiment.

FIG. 9 shows the sub-BMU unit for calculating $\lambda_k(\mathbb{A}_0, 1)$. The unit 30 comprises three distance calculators, indicated generally at 31, a multiplexer 32, and two comparators indicated generally at 33. The distance calculators 31 receive respective hypothesized sample values $\tilde{y}_k^j$, $j \in \{0, 1, 2\}$. In this example with h=(1), the hypothesized sample values $\tilde{y}_k^0, \tilde{y}_k^1$ and $\tilde{y}_k^2$ correspond respectively to the three symbols $\mathbb{A}(0)$, $\mathbb{A}(2)$ and $\mathbb{A}(4)$ in subset $\mathbb{A}_0$. Each distance calculator also receives the current sample $z_k(l)$ and calculates a respective distance value $d_k^j$ indicating distance of $z_k(l)$ from $\tilde{y}_k^j$ as described above. The distance values $d_k^j$ are output to multiplexer 32. Comparators 33, connected in parallel with the distance calculators, receive respective threshold values $\theta(0), \theta(1)$. The thresholds $\theta(0)$ and $\theta(1)$ are defined as halfway between respective pairs of hypothesized values $\tilde{y}_k^j$ arranged in value order: $\tilde{y}_k^0 < \tilde{y}_k^1 < \tilde{y}_k^2$. In this example, $\theta(0) = \mathbb{A}(1)$ and $\theta(1) = \mathbb{A}(3)$. The second input of each comparator receives the input sample $z_k(l)$. Each comparator compares the sample $z_k(l)$ with the corresponding threshold. The two comparator output bits collectively constitute a select signal, indicating the result of the threshold comparison, which is supplied to a control input of multiplexer 32. The 2-bits of the select signal indicate the optimum (here minimum) distance value $d_k^j$ to be selected as $\lambda_k(\mathbb{A}_0, 1)$ according to:

$$\lambda_k(\mathbb{A}_0, l) = \begin{cases} d_k^0, & \text{if } z_k(l) \leq \theta(0) \\ d_k^1, & \text{if } \theta(0) < z_k(l) \leq \theta(1) \\ d_k^2, & \text{if } \theta(1) < z_k(l) \end{cases}$$

Figure 10:
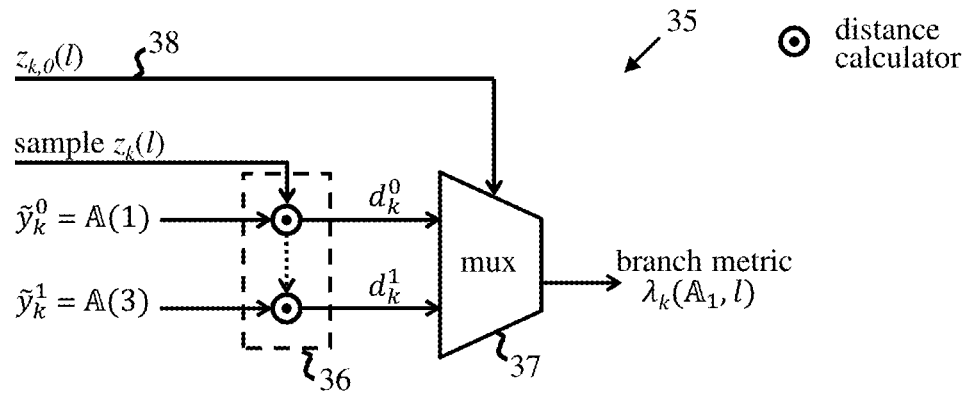

FIG. 10 shows the sub-BMU unit for calculating $\lambda_k(\mathbb{A}_1, 1)$. The unit 35 comprises two distance calculators 36, a multiplexer 37 and a control input 38. The distance calculators 36 receive respective hypothesized sample values $\tilde{y}_k^j$, $j \in \{0,1\}$. In this example, the hypothesized sample values $\tilde{y}_k^0$, and $\tilde{y}_k^1$ correspond respectively to the symbols $\mathbb{A}(1)$ and $\mathbb{A}(3)$ in subset $\mathbb{A}_1$. Each distance calculator calculates a respective distance value $d_k^j$ indicating distance of the sample $z_k(l)$ from $\tilde{y}_k^j$. The distance values $d_k^0$ and $d_k^1$ are output to multiplexer 37. For this unit, there is a single threshold, $\theta(0) = \mathbb{A}(2) = 0$, halfway between the two hypothesized values $\tilde{y}_k^0 = \mathbb{A}(1)$, and $\tilde{y}_k^1 = \mathbb{A}(3)$. Here therefore, the result of the threshold comparison depends on whether $z_k(l) > 0$ or $z_k(l) < 0$. The comparison logic can therefore be implemented simply by extracting the sign bit, denoted here by $z_{k,0}(l)$, of sample $z_k(l)$. The sign bit by $z_{k,0}(l)$ is supplied on control input 38 to multiplexer 37. The sign bit $z_{k,0}(l)$ determines the optimum (here minimum) distance value $d_k^j$ to be selected as $\lambda_k(\mathbb{A}_1, 1)$ according to:

$$\lambda_k(\mathbb{A}_1, l) = \begin{cases} d_k^0, & \text{if } z_k(l) \leq 0 \\ d_k^1, & \text{if } 0 < z_k(l) \end{cases}$$

The 4-D branch metrics for transitions in the FIG. 8 trellis are obtained by combining contributions from the 1-D branch metrics over all dimensions, e.g. by selecting the minimum of $\lambda_k(\mathbb{A}_0, 1)$ and $\lambda_k(\mathbb{A}_1, 1)$ for each dimension and adding the four selected values in each case.

Figure 11:
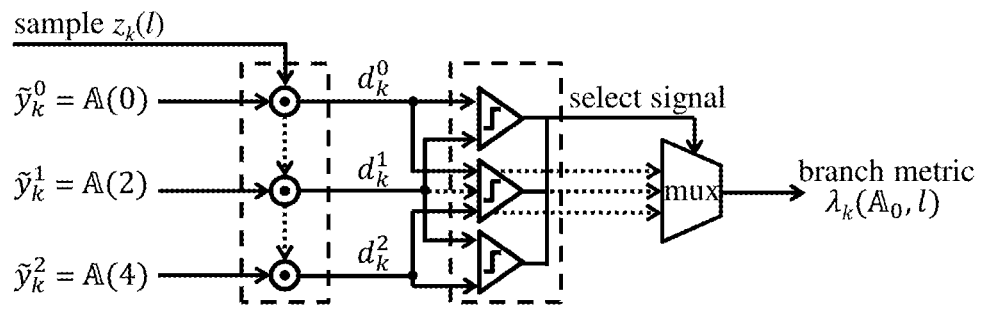
FIGS. 11 and 12 show corresponding components of a conventional branch metric unit.
Figure 12:
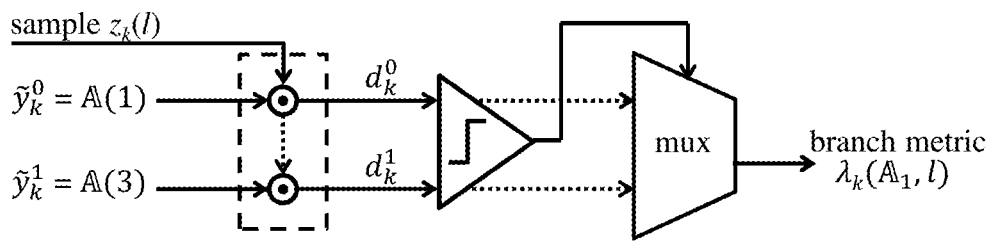

The propagation delay of sub-BMU unit 30 is the sum of that of a distance calculator and a 3-to-1 multiplexer. Similarly, the propagation delay of sub-BMU unit 35 is the sum of that of a distance calculator and a 2-to-1 multiplexer. By comparison, corresponding sub-units for calculating $\lambda_k(\mathbb{A}_0, 1)$ and $\lambda_k(\mathbb{A}_1, 1)$ in a conventional BMU are shown in FIGS. 11 and 12 respectively. In FIG. 11, the propagation delay is the sum of that of a distance calculator, a digital comparator and a 3-to-1 multiplexer. Hence, the propagation delay of one comparator is eliminated in the FIG. 9 embodiment. The FIG. 9 circuit also requires one less comparator. In FIG. 12, the propagation delay is the sum of that of a distance calculator, a digital comparator and a 2-to-1 multiplexer. Hence, the propagation delay of one comparator is eliminated in the FIG. 10 embodiment, and no comparator is required in this circuit.

In the 1-step 8-state 4-D 5-PAM detector with channel time-dispersion length |h|=1 above, there are four sub-BMU's so a total of eight comparators are eliminated compared to a conventional implementation. The principles described can be readily applied for BMU operation with a channel time-dispersion length |h|>1, resulting in even greater savings. For example, with |h|=2, the BMU needs 32 sub-BMUs whereby 64 comparators are eliminated. Implementation complexity and power consumption increase with the number of time steps for which the BMU calculates branch metrics as well as with the number of states. For a 2-step 8-state 4-D 5-PAM Viterbi detector with |h|=1, for example, the BMU complexity is at least quadrupled compared to the 1-step embodiment above, whereby 32 comparators can be eliminated. Typically, 1≤N≤4 for a N-step 8-state 4-D 5-PAM Viterbi detector, and the saving increases substantially with N.

While a full-state Viterbi detector is described for the second embodiment above, the detector could be a reduced-state detector in the presence of intersymbol interference (ISI). In this case, the ISI attributable to the channel coefficients can be suppressed by embedded per-survivor decision feedback to avoid expanding the number of detector states.

Numerous changes and modifications can of course be made to the exemplary embodiments described. For example, while the smallest distance value is selected as the optimum branch metric above, embodiments may be envisaged where the largest distance value is selected as optimum. Other difference metrics, such as squared Euclidean distance, may be used for calculating the distance values. Embodiments may also be envisaged where a threshold θ used for level discrimination is not halfway between a pair of hypothesized sample values. Where the signal constellation does not contain equiprobable symbols, for example, thresholds may be adapted to accommodate different symbol probabilities.

The branch metric calculation method can be applied with any number of encoder and/or channel states, and with or without a coded or coded-modulation scheme, such as trellis-coded modulation. When a transmission scheme with many encoder/channel states is adopted (such as that in the IEEE 802.3ab standard), or when an architecture based on the sliding-block or systolic-array approach is chosen, the advantages described have a huge impact on overall efficiency of the detector.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for calculating branch metrics, associated with possible transitions between states of a trellis, in a sequence detector for detecting symbol values corresponding to samples of an analog signal transmitted over a channel, the method comprising, for each said sample and each said transition:
   calculating a plurality of distance values indicative of distance between that sample and respective hypothesized sample values for that transition;
   in parallel with calculation of said distance values, comparing the sample with a set of thresholds, each threshold defined between a pair of successive said hypothesized sample values arranged in value order, to produce a comparison result; and
   selecting an optimum distance value as a branch metric for the transition in dependence on said comparison result.

2. The method as claimed in claim 1 wherein each threshold is defined as halfway between said pair of hypothesized sample values.

3. The method as claimed in claim 1 including selecting the minimum distance value as said branch metric.

4. The method as claimed in claim 1 including calculating each distance value as the modulus of the difference between the sample and the respective hypothesized sample value.

5. The method as claimed in claim 1 for use with a channel having an impulse response with L>0 interfering channel coefficients, the method including selecting said optimum distance value in dependence on said comparison result and the sign of each said channel coefficient.

6. A branch metric unit for calculating branch metrics, associated with possible transitions between states of a trellis, in a sequence detector for detecting symbol values corresponding to samples of an analog signal transmitted over a channel, the branch metric unit comprising, for each said transition:
   distance calculation logic adapted to calculate, for each said sample, a plurality of distance values indicative of distance between that sample and respective hypothesized sample values for that transition;
   comparison logic, connected in parallel with the distance calculation logic, adapted to compare each sample with a set of thresholds, each threshold defined between a pair of successive said hypothesized sample values arranged in value order, to produce a comparison result; and
   selection logic adapted to select, for each said sample, an optimum distance value as a branch metric for the transition in dependence on said comparison result for that sample.

7. The branch metric unit as claimed in claim 6 wherein each threshold is defined as halfway between said pair of hypothesized sample values.

8. The branch metric unit as claimed in claim 6 wherein the selection logic is adapted to select the minimum distance value as said branch metric.

9. The branch metric unit as claimed in claim 6 wherein the distance calculation logic is adapted to calculate each distance value as the modulus of the difference between the sample and the respective hypothesized sample value.

10. The branch metric unit as claimed in claim 6 for use with a channel having an impulse response with L>0 interfering channel coefficients, wherein the selection logic is adapted to select said optimum distance value in dependence on said comparison result and the sign of each said channel coefficient.

11. The branch metric unit as claimed in claim 6, the unit being adapted to calculate branch metrics in a two-state 4-PAM Viterbi detector.

12. The branch metric unit as claimed in claim 6, the unit being adapted to calculate branch metrics in an eight-state 4-D 5-PAM Viterbi detector.

13. A sequence detector for detecting symbol values corresponding to a sequence of samples of an analog signal transmitted over a channel, the sequence detector comprising:
   a branch metric unit as claimed in claim 6 for calculating branch metrics for each said sample and each said transition, said branch metric unit comprising, for each said transition:
   distance calculation logic adapted to calculate, for each said sample, a plurality of distance values indicative of distance between that sample and respective hypothesized sample values for that transition;
   comparison logic, connected in parallel with the distance calculation logic, adapted to compare each sample with a set of thresholds, each threshold defined between a pair of successive said hypothesized sample values arranged in value order, to produce a comparison result; and
   selection logic adapted to select, for each said sample, an optimum distance value as a branch metric for the transition in dependence on said comparison result for that sample;
   a path metric unit, arranged to receive branch metrics from the branch metric unit, adapted to calculate path metrics for respective survivor paths to each state of said trellis and to select, for each state, a latest symbol value in the survivor path to that state in dependence on the branch metrics; and
   a survivor memory unit arranged to receive said latest symbol value in the survivor path to each state from the path metric unit and adapted to select, at the end of said sequence of samples, a survivor path corresponding to said sequence.

14. The sequence detector as claimed in claim 13 wherein, in the branch metric unit, each said threshold is defined as halfway between said pair of hypothesized sample values.

15. The sequence detector as claimed in claim 13 wherein, in the branch metric unit, the selection logic is adapted to select the minimum distance value as said branch metric.

16. The sequence detector as claimed in claim 13 wherein, in the branch metric unit, the distance calculation logic is adapted to calculate each distance value as the modulus of the difference between the sample and the respective hypothesized sample value.

17. The sequence detector as claimed in claim 13 for use with a channel having an impulse response with L>0 interfering channel coefficients, wherein, in the branch metric unit, the selection logic is adapted to select said optimum distance value in dependence on said comparison result and the sign of each said channel coefficient.

18. The sequence detector as claimed in claim 13 wherein the branch metric unit, path metric unit and survivor memory unit are adapted to collectively implement a two-state 4-PAM Viterbi detector.

19. The sequence detector as claimed in claim 13 wherein the branch metric unit, path metric unit and survivor memory unit are adapted to collectively implement an eight-state 4-D 5-PAM Viterbi detector.

20. A computer program product comprising a non-transitory computer readable storage medium having program instructions embodied therein, the program instructions being executable by a processing device to cause the processing device to perform a method for calculating branch metrics, associated with possible transitions between states of a trellis, during sequence detection for detecting symbol values corresponding to samples of an analog signal transmitted over a channel, said method comprising, for each said sample and each said transition:

calculating a plurality of distance values indicative of distance between that sample and respective hypothesized sample values for that transition;

in parallel with calculation of said distance values, comparing the sample with a set of thresholds, each defined between a pair of successive said hypothesized sample values arranged in value order, to produce a comparison result; and selecting an optimum distance value as a branch metric for the transition in dependence on said comparison result.

* * * * *